United States Patent
Bonora et al.

(10) Patent No.: US 6,494,308 B2
(45) Date of Patent: *Dec. 17, 2002

(54) INTEGRATED ROLLER TRANSPORT POD AND ASYNCHRONOUS CONVEYOR

(75) Inventors: Anthony C. Bonora, Menlo Park; Richard H. Gould, Fremont, both of CA (US)

(73) Assignee: Asyst Technologies, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/781,060

(22) Filed: Feb. 8, 2001

(65) Prior Publication Data

US 2001/0008201 A1 Jul. 19, 2001

Related U.S. Application Data

(62) Division of application No. 09/103,479, filed on Jun. 24, 1998, now Pat. No. 6,223,886.

(51) Int. Cl.[7] .............................................. B65G 25/00
(52) U.S. Cl. .............................. 198/465.2; 198/465.1; 198/464.2; 414/940
(58) Field of Search .......................... 198/465.2, 465.1, 198/464.2, 867.01, 867.13, 571, 572, 577, 604; 414/940

(56) References Cited

U.S. PATENT DOCUMENTS

| | | |
|---|---|---|
| 3,746,148 A | 7/1973 | Hilger et al. |
| 3,840,110 A | 10/1974 | Molt et al. |
| 3,927,620 A | 12/1975 | Clapham |
| 3,976,330 A | 8/1976 | Babinski et al. |
| 4,014,428 A | 3/1977 | Ossbahr |
| 4,093,084 A | 6/1978 | Ringer |
| 4,305,335 A | 12/1981 | Plugge |

(List continued on next page.)

FOREIGN PATENT DOCUMENTS

| | | |
|---|---|---|
| EP | 0 674 069 A1 | 9/1995 |

*Primary Examiner*—Khoi H. Tran
(74) *Attorney, Agent, or Firm*—O'Melveny & Myers, LLP

(57) ABSTRACT

A system for transporting articles. The transport system includes a conveyor system which includes a transport device for carrying articles between workstations and a drive rail and a support rail for supporting the transport device. The drive rail includes a drive system for propelling the transport device between workstations. At least one shoe carried by the transport device rides on the support rail for movably supporting the transport device on the support rail. The transport system also includes a protective container including a housing having an interior compartment for supporting a plurality of articles. The bottom surface of the housing is configured to engage the drive system such that actuation of the drive system propels the housing along the drive and support rails. At least one shoe carried by the housing is configured to ride on the support rail of the conveyor system to movably support the housing on the support rail. The transport system also includes the method of transporting articles including the steps of providing a transport device for holding at least one article and having at least one shoe, positioning the transport device with the base of the device supported on a drive rail and the shoe supported on a support rail, and actuating a drive system carried by the drive rail to propel the transport device along the drive rail and support rail.

2 Claims, 10 Drawing Sheets

U.S. PATENT DOCUMENTS

| | | |
|---|---|---|
| 4,389,941 A | 6/1983 | Berk et al. |
| 4,453,627 A | 6/1984 | Wilkins |
| 4,461,382 A | 7/1984 | Hoover et al. |
| 4,513,854 A | 4/1985 | Prodel et al. |
| 4,515,264 A | 5/1985 | Sticht |
| 4,530,287 A | 7/1985 | Sticht |
| 4,534,462 A | 8/1985 | Hoover et al. |
| 4,572,358 A | 2/1986 | Swain |
| 4,619,205 A | 10/1986 | Sticht |
| 4,793,262 A | 12/1988 | Horn |
| 4,805,759 A | 2/1989 | Rochet et al. |
| 4,826,360 A | 5/1989 | Iwasawa et al. |
| 4,926,753 A | 5/1990 | Weiss |
| 4,940,000 A | 7/1990 | Horvath et al. |
| 4,974,519 A | 12/1990 | Miletto |
| 5,009,306 A | 4/1991 | Roderick et al. |
| 5,086,910 A | 2/1992 | Terpstra |
| 5,129,507 A | 7/1992 | Maeda et al. |
| 5,213,201 A | 5/1993 | Huber et al. |
| 5,285,887 A | 2/1994 | Hall |
| 5,318,167 A | 6/1994 | Bronson et al. |
| 5,452,801 A | 9/1995 | Horn |
| 5,521,563 A | 5/1996 | Mazzochette |
| 5,533,844 A | 7/1996 | Ekleberry |
| 5,673,804 A | 10/1997 | Weiss et al. |
| 6,050,768 A * | 4/2000 | Iwasaki et al. ........ 414/222.01 |
| 6,223,886 B1 * | 5/2001 | Bonora et al. ........... 198/465.2 |
| 6,308,818 B1 * | 10/2001 | Bonora et al. ........... 198/465.1 |

* cited by examiner

FIG._1

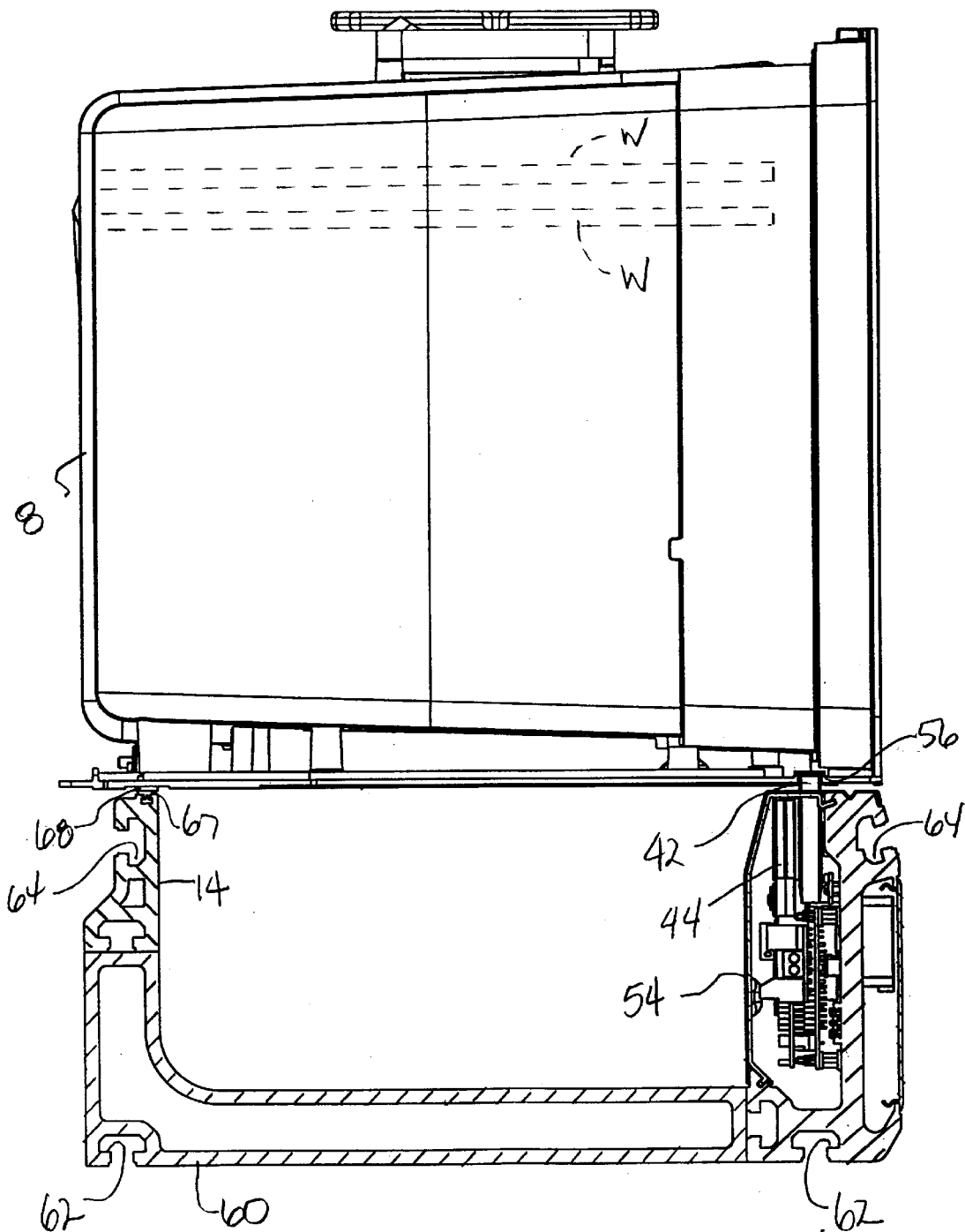
FIG._3

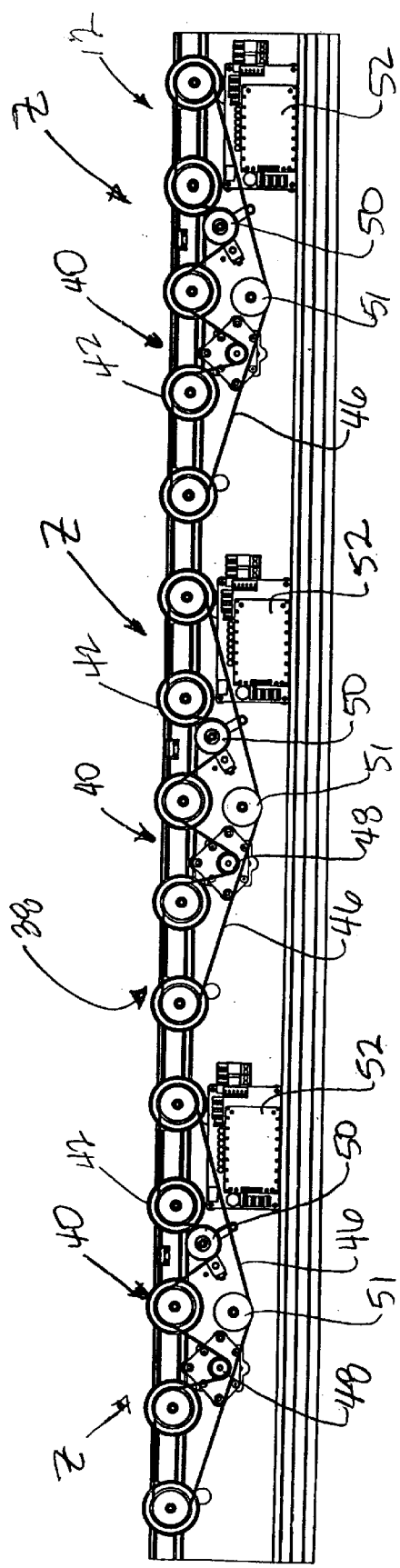
FIG._4
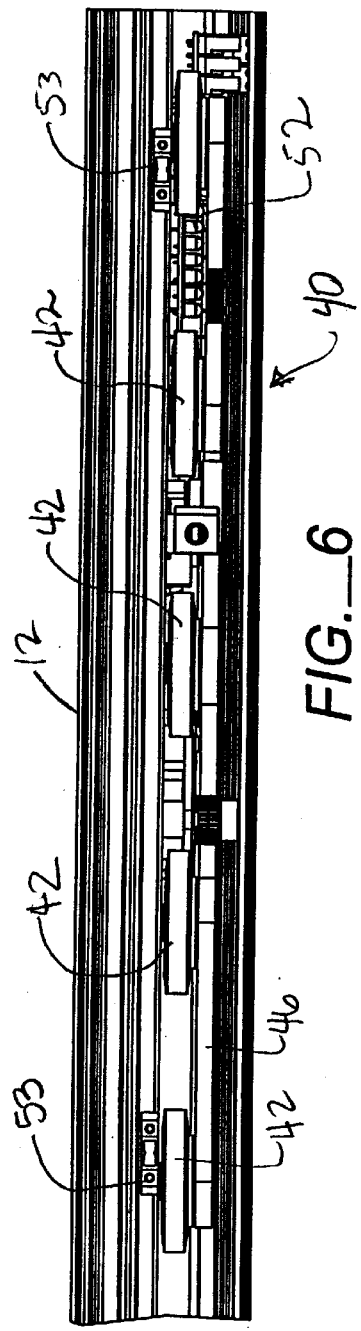
FIG._6

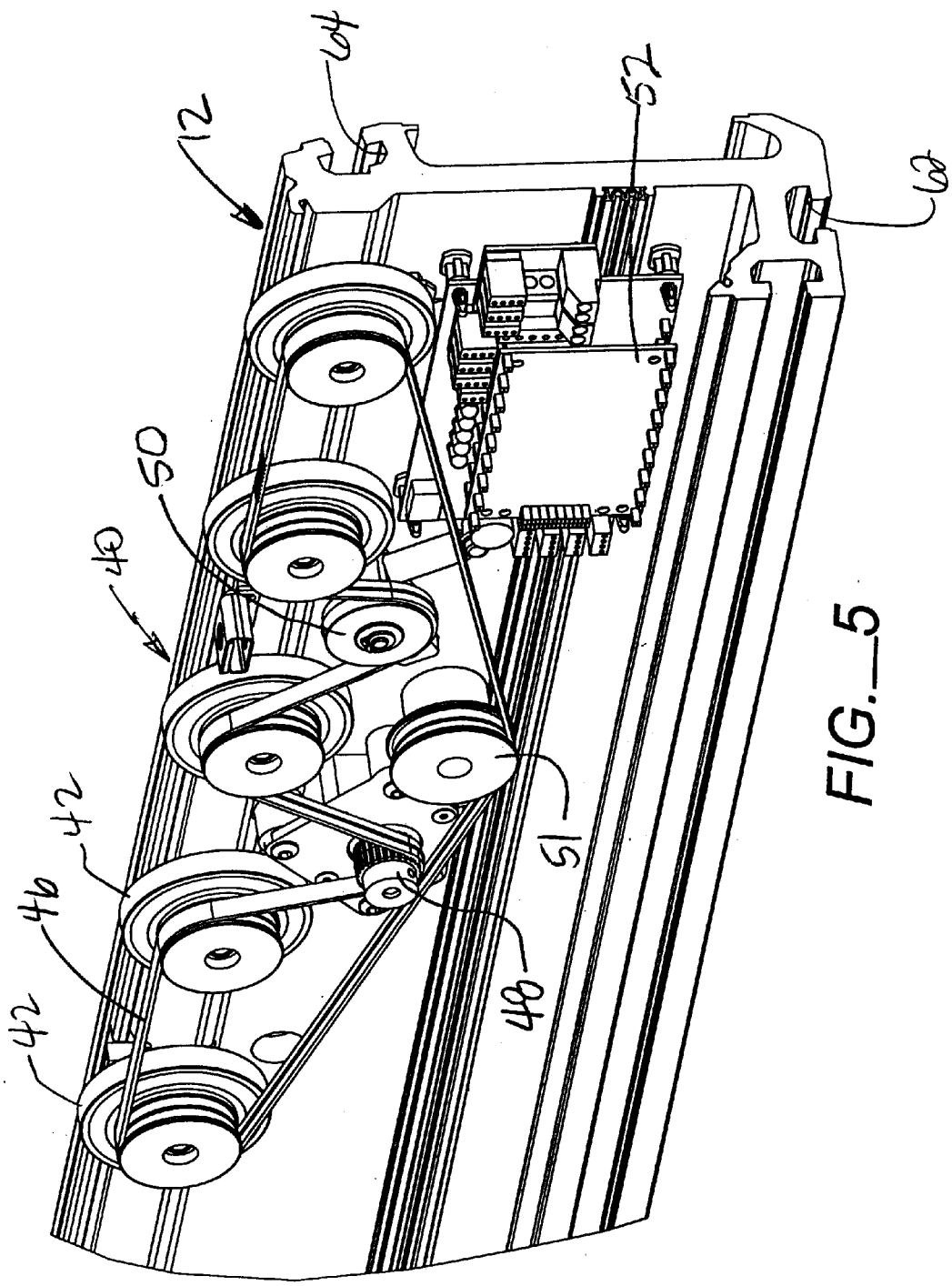
FIG._5

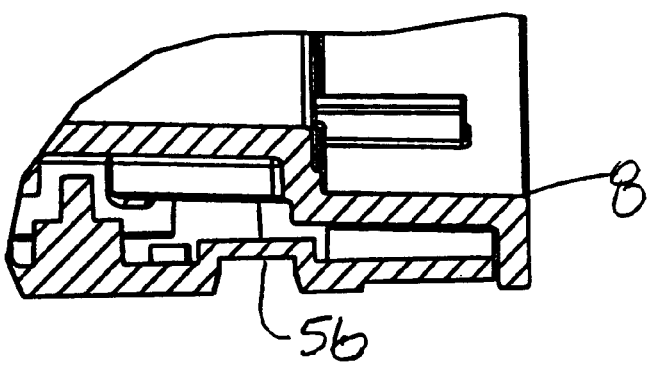
FIG._7
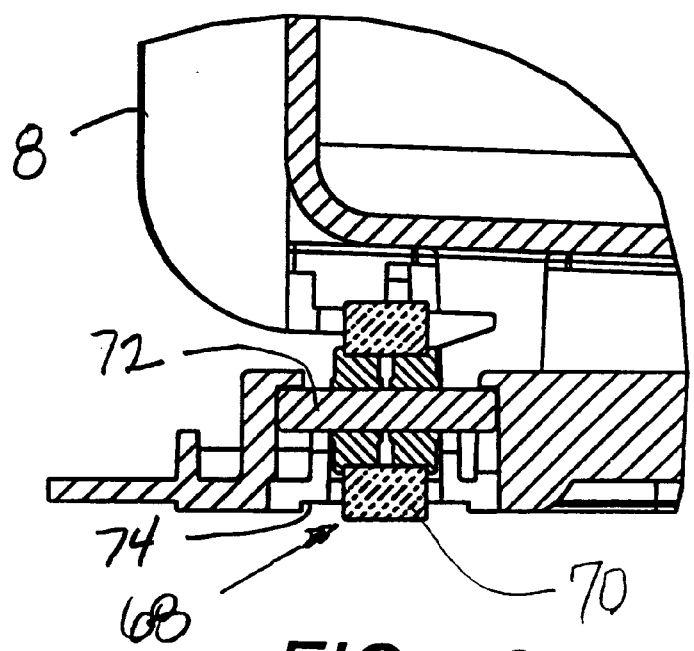
FIG._8

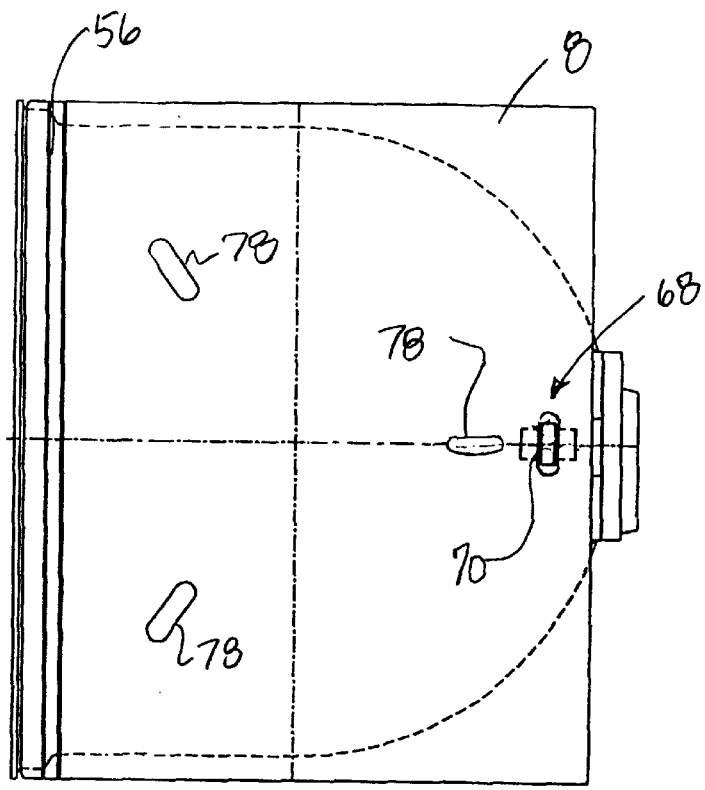
FIG._9
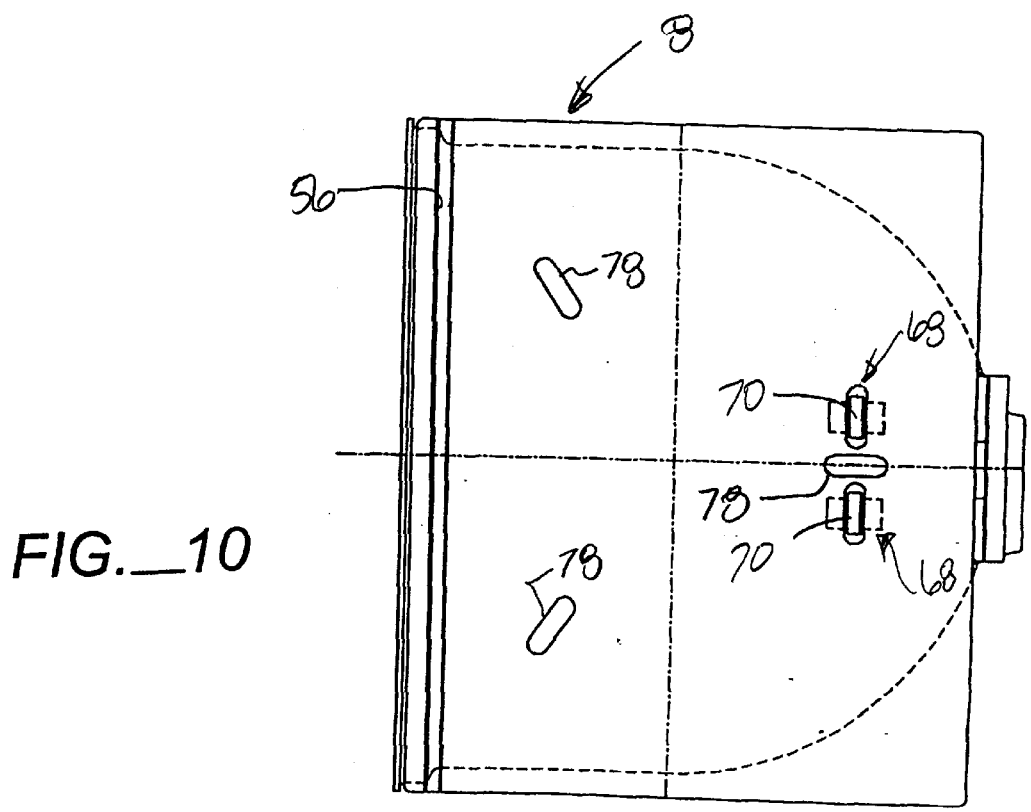
FIG._10

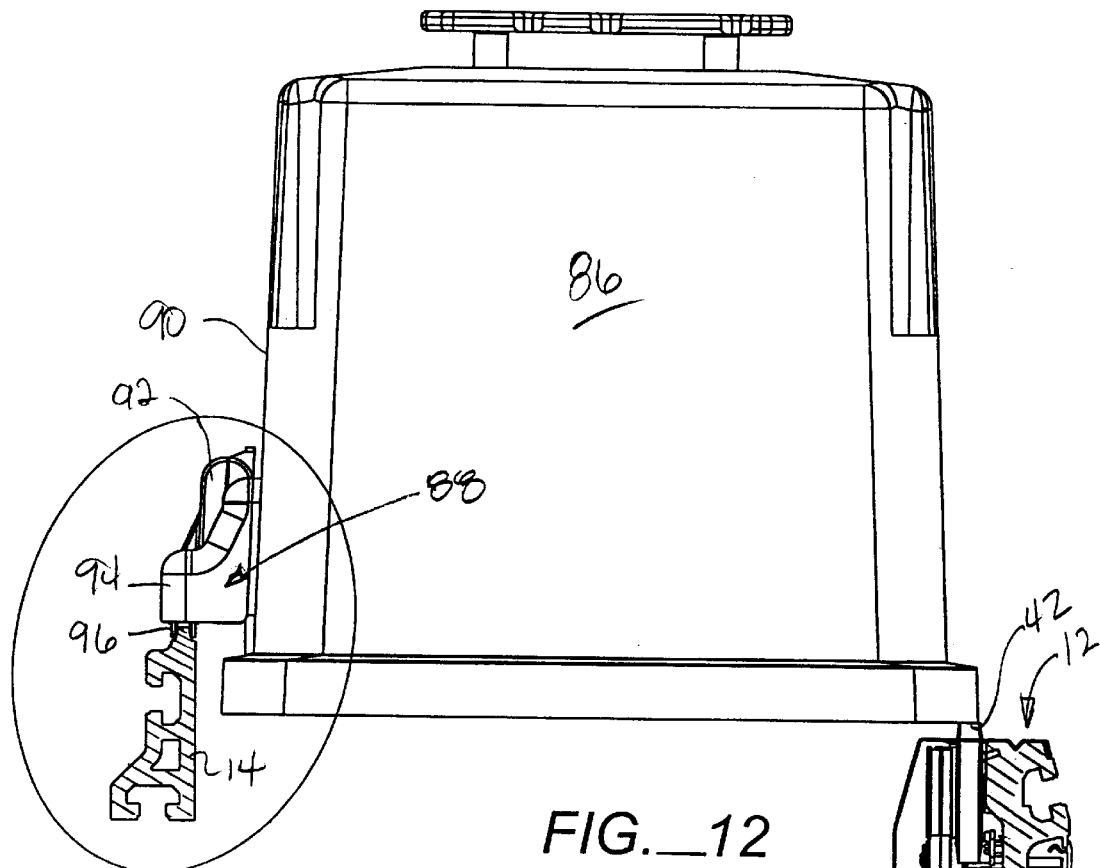
FIG._12
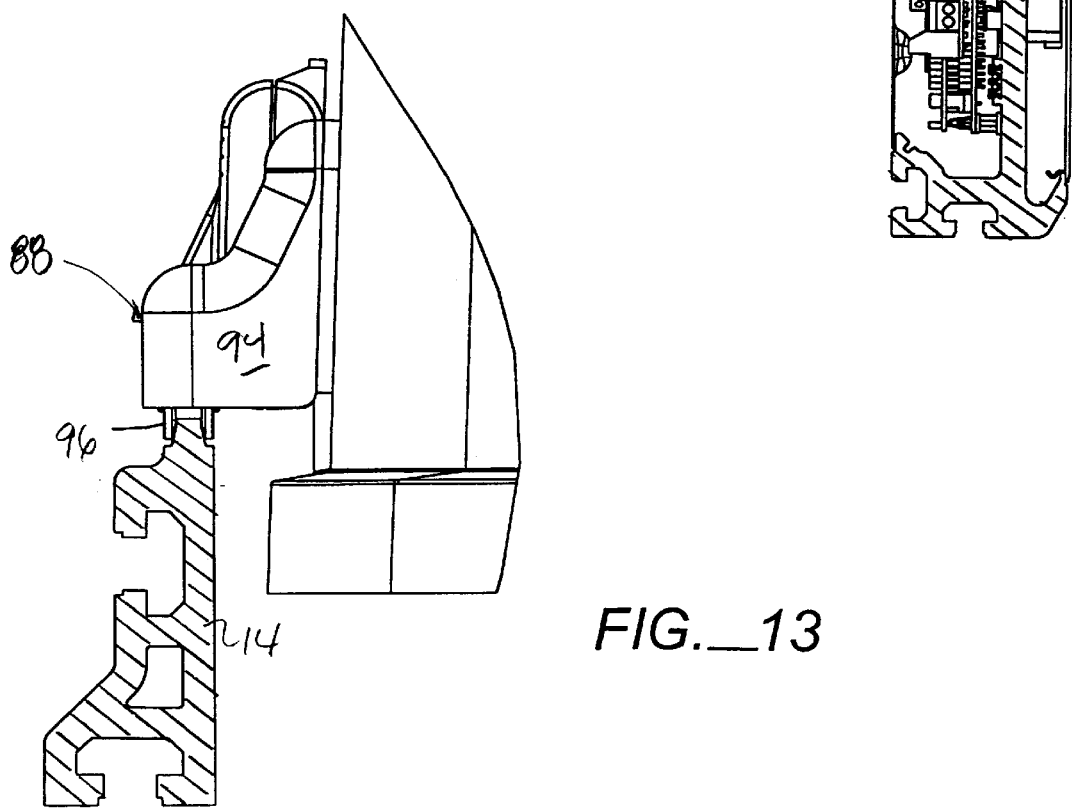
FIG._13

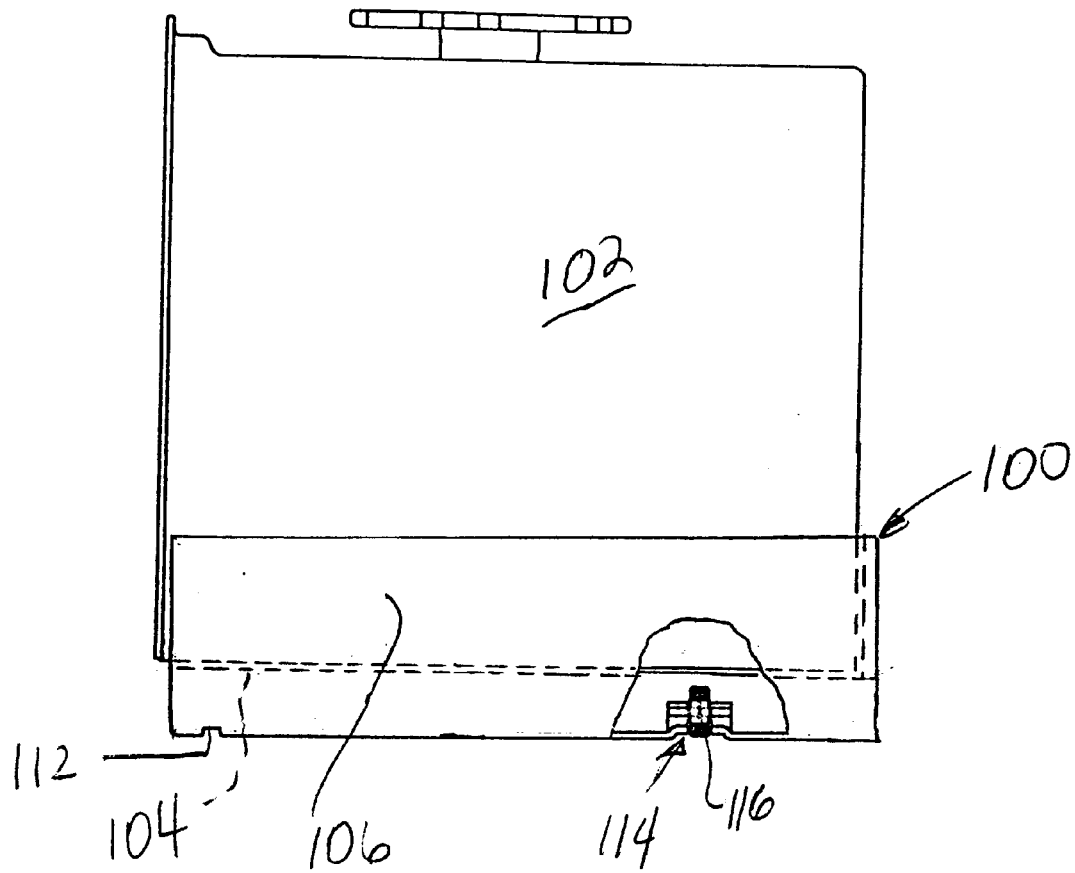
FIG._14
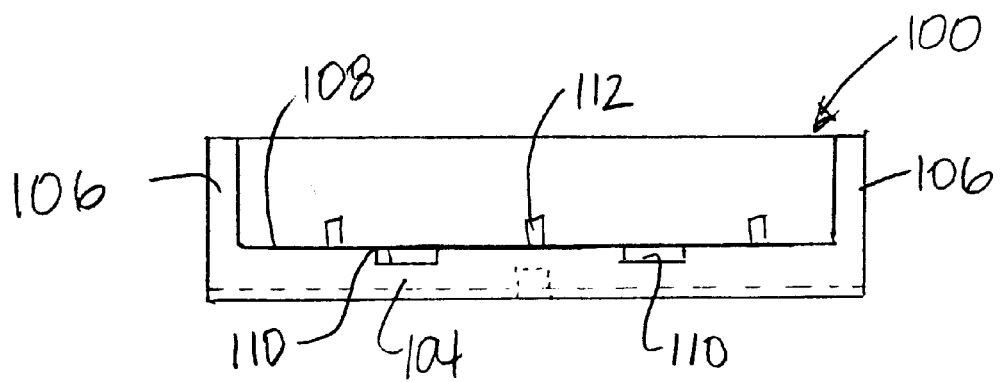
FIG._15

INTEGRATED ROLLER TRANSPORT POD AND ASYNCHRONOUS CONVEYOR

This is a division of application Ser. No. 09/103,479 filed Jun. 24, 1998, now U.S. Pat. No. 6,223,886.

BRIEF DESCRIPTION OF THE INVENTION

The present invention relates in general to a system of transporting articles between stations and, more particularly, to a transport system for safely moving delicate or valuable articles between work stations.

BACKGROUND OF THE INVENTION

In various fields, delicate or valuable articles must be safely transported between work stations and the like without damaging or destroying the articles. Articles requiring careful handling include, but are not limited to, pharmaceuticals, medical systems, flat panel displays, computer hardware as for example disc drive systems, modems and the like, and semiconductor wafers.

In general, integrated circuits are manufactured by forming a plurality of layers on a substrate such as a semiconductor wafer. A variety of processing machines are used to form the individual layer, with the wafer typically being delivered to several different machines before the integrated circuits are completed. In addition to equipment for depositing films on the wafer, the semiconductor wafer may also be cleaned or conditioned at various stages by suitable equipment. With advances in technology, integrated circuits have become increasingly complex and typically include multiple layers of intricate wiring. The size of the integrated circuits has decreased, greatly increasing the number of such devices on a single wafer. As a result of the increased complexity and decreased size of the integrated circuits, the value of the semiconductor wafer increases substantially as the wafer progresses through the various processing stages. The standard size of the semiconductor wafers will increase from 200 mm to 300 mm in the next few years, further increasing the number of integrated circuits which may be formed on a single wafer and therefore the value of each wafer. Considerable care must be taken in handling the semiconductor wafers, particularly during the later processing stages, since a damaged wafer could result in considerable monetary losses. The semiconductor wafers must be retained in a clean room environment, substantially free of particulate contamination, to preserve the purity of the layers deposited on the wafer. The requirement of a clean room environment places additional constraints on the handling of the semiconductor wafers.

For additional protection against contaminants, the semiconductor wafers are typically retained in sealed transport pods as they are moved throughout the manufacturing facility to minimize any exposure to the environment outside of the processing machines. The manufacturing facility is usually organized into a plurality of bays each including several processing machines. After the wafers in a pod have been treated at one or more of the machines, the pod leaves the bay and is transported to the next processing bay. Thus, there are essentially two types of transport loops in the manufacturing facility—the inter-bay loop in which the pods are moved between the bays, and the intra-bay loop in which the pods are moved between the processing machines of a single bay. A system which may be used to conveniently, safely and efficiently handle and transport the pods is desirable. A pod transport system which maximizes the utilization of the machines in the processing bay is also desirable.

Various conveying systems have been employed to transport the pods from bay to bay along the inter-bay loop of a manufacturing facility. Because of the amount of traffic in the inter-bay loop of the manufacturing facility, inter-bay transport is typically accomplished via overhead conveyor systems. The pods are delivered to a robotic storage house, often referred to as a "stocker", which receives the pods and automatically delivers the pods to the intra-bay loop. With some systems, the inter-bay conveyor system is coupled to the intra-bay conveyor system for direct transfer between the systems. However, direct transfer may be obtained only when a compatible, overhead conveyor system is used in the intra-bay loop.

Within the bays, the transport pods must be carried from machine to machine and delivered to a position where the wafers may be unloaded from the pod by the machine for processing. The machine entrance is often provided with a load port where the wafers may be automatically removed from the transport pod in a protected environment. Transferring the pods to the load port requires greater precision and control over the pod than moving the pods between the inter-bay conveyor and the bays. Various methods are employed to move the transport pods between the different processing machines in a bay. For example, many systems rely upon human workers to transfer the transport pods from port to port using a cart. The worker may manually lift the pod to the port. Alternatively, the worker may actuate a manual robotic link or other lifting device to move the pod to the port and, after processing has been completed, to return the transport pod to the cart. The worker then moves the cart to the next machine and repeats the process. Relying on human workers to transport the pods from machine to machine is time consuming and inefficient. Often, the worker will not be on hand to position a pod of fresh wafers in the load port and the machine will sit in a stand-by mode reducing the time during which the machine is operating and the overall efficiency of the processing factory. Moreover, care must be taken to ensure the lifting device is properly aligned with the load port as dropping the pod or exposing the pod to sharp jolts may damage the wafers and could cause up to millions of dollars of damage. A means of automatically moving the transport pods between machines is desirable.

Another system of intra-bay transport relies upon automatic guided vehicles (AGVs) which carry the pods between the machines and move the pods into the load port. Using AGVs reduces the need for a worker in the bay and may increase the speed at which the pods are moved through the bay. However, the size of the bay limits the number of AGVs which may operate in a single bay, leaving the machines in a stand-by mode waiting for the AGV to remove the pod of processed wafers and deposit a pod of fresh wafers in the transfer bay. An automated system which may be used to rapidly deliver pods to and remove pods from the processing machines without leaving the machines in a stand-by mode is desirable.

Overhead monorail systems are also used to transport pods along the intra-bay loop. Hoists or similar devices are used to lower the pods onto the load port of the processing machine. In order to successfully transfer the pod from the monorail to the machine, the pod must be precisely aligned with the load port and lowered onto the port in a controlled manner such that any swing of the pod is minimized. After processing, the pod is raised and transported to the next machine. Repeatedly raising and lowering the pod is challenging. An automated conveyor system which positions the pod for direct, efficient transfer to the load port is desirable.

Conveyor systems for transporting materials are well known. Examples of standard conveyors include conveyor belt systems and roller systems where the articles are transported across a plurality of rotating rollers. While these systems provide a useful means of transport in most circumstances, they are not suitable for transporting pods in a clean room environment. Moreover, these systems do not offer precise control over the acceleration and deceleration of the pod which is required to prevent shifting of the wafers within the pods.

Another type of conveyor system which may be adapted for clean room use includes a pair of spaced rails each having a drive system for supporting an article and propelling the article along the rails. The competition between the two drive systems may cause the article to shimmy as it moves along the rails. A modification of this conveyor system includes a drive system on one rail and guide wheels on the other rail to allow the article to move freely along the rails. Unless the drive system, guide wheels and features of the transport pod are in exact, horizontal alignment, the guide wheels may cause the article to tip slightly such that each guide wheel imparts a slight impact on the article. While these adverse effects may be a minor inconvenience for most articles, the vibrations can have adverse effects on the delicate, expensive semiconductor wafers carried by the transport pod. A conveyor system for safely and protectively transporting semiconductor wafers is desirable.

OBJECTS AND SUMMARY OF THE INVENTION

It is a primary object of the present invention to provide a system for transporting articles such as semiconductor wafers.

It is a further object of the present invention to provide a system for transporting articles in a clean room environment.

It is another object of the present invention to provide a conveyor system which may be used to automatically move a plurality of articles between a number of processing machines.

It is still another object of the present invention to provide a conveyor system which may be used to automatically move a plurality of articles between a number of processing bays.

It is yet another object of the present invention to provide a conveyor system which provides precise control over the movement of the articles along the conveyor system.

A more general object of the present invention is to provide a conveyor system which may be efficiently constructed, operated and maintained.

In summary, the present invention provides a system for transporting articles, including a conveyor system, a transport device and a method of transporting the articles. The conveyor system includes a transport device which carries the article between workstations. The transport device may carry a container such as a transport pod which houses the articles, or the transport device may be part of the container. The conveyor system also includes a drive rail and a support rail for supporting the transport device. The drive rail includes a drive system for propelling the transport device between workstations. At least one shoe, such as a wheel, is carried by the transport device. The shoe is configured to ride on the support rail for movably supporting the transport device on the support rail.

The transport system also includes a protective container for carrying a plurality of articles along the conveyor system. The container includes a housing having an interior compartment and a bottom surface which is positionable on the drive and support rails of the conveyor system. The bottom surface of the housing is configured to engage the drive system such that actuation of the drive system propels the housing along the drive and support rails. The interior compartment is configured to retain a plurality of articles, for example semiconductor wafers. At least one shoe is carried by the housing. The shoe is configured to ride on the support rail of the conveyor system to movably support the housing on the support rail.

The method of the invention includes the steps of providing a transport device for holding at least one article and having a base and at least one shoe, and positioning the transport device with the base of the transport device supported on a drive rail and the shoe carried by the transport device supported on a support rail of a conveyor system. The method also includes the step of actuating a drive system carried by the drive rail to propel the transport device along the drive rail and support rail.

Additional objects and features of the invention will be more readily apparent from the following detailed description and appended claims when taken in conjunction with the drawings.

BRIEF DESCRIPTION OF THE DRAWINGS

FIG. 3 is a sectional view taken substantially along line 3—3 of FIG. 1.

FIG. 4 is a plan view of a section of the drive rail of the conveyor system of FIG. 1.

FIG. 5 is an enlarged, pictorial view of a section of the drive rail of FIG. 4.

FIG. 6 is an enlarged top plan view of the drive rail of FIG. 4.

FIGS. 7 and 8 are enlarged, sectional views of portions of the transport pod of FIG. 3.

FIG. 9 is a bottom plan view of the transport pod of FIG. 1.

FIG. 10 is a bottom plan view of another embodiment of a transport pod.

FIG. 12 is a cross sectional view taken substantially along line 12—12 of FIG. 11.

FIG. 13 is an enlarged, sectional view of the circled area of FIG. 12.

FIG. 14 is a side plan view of another embodiment of a transport device in accordance with the present invention.

FIG. 15 is a front plan view of the transport device of FIG. 14.

DETAILED DESCRIPTION OF THE INVENTION

Figure 1:
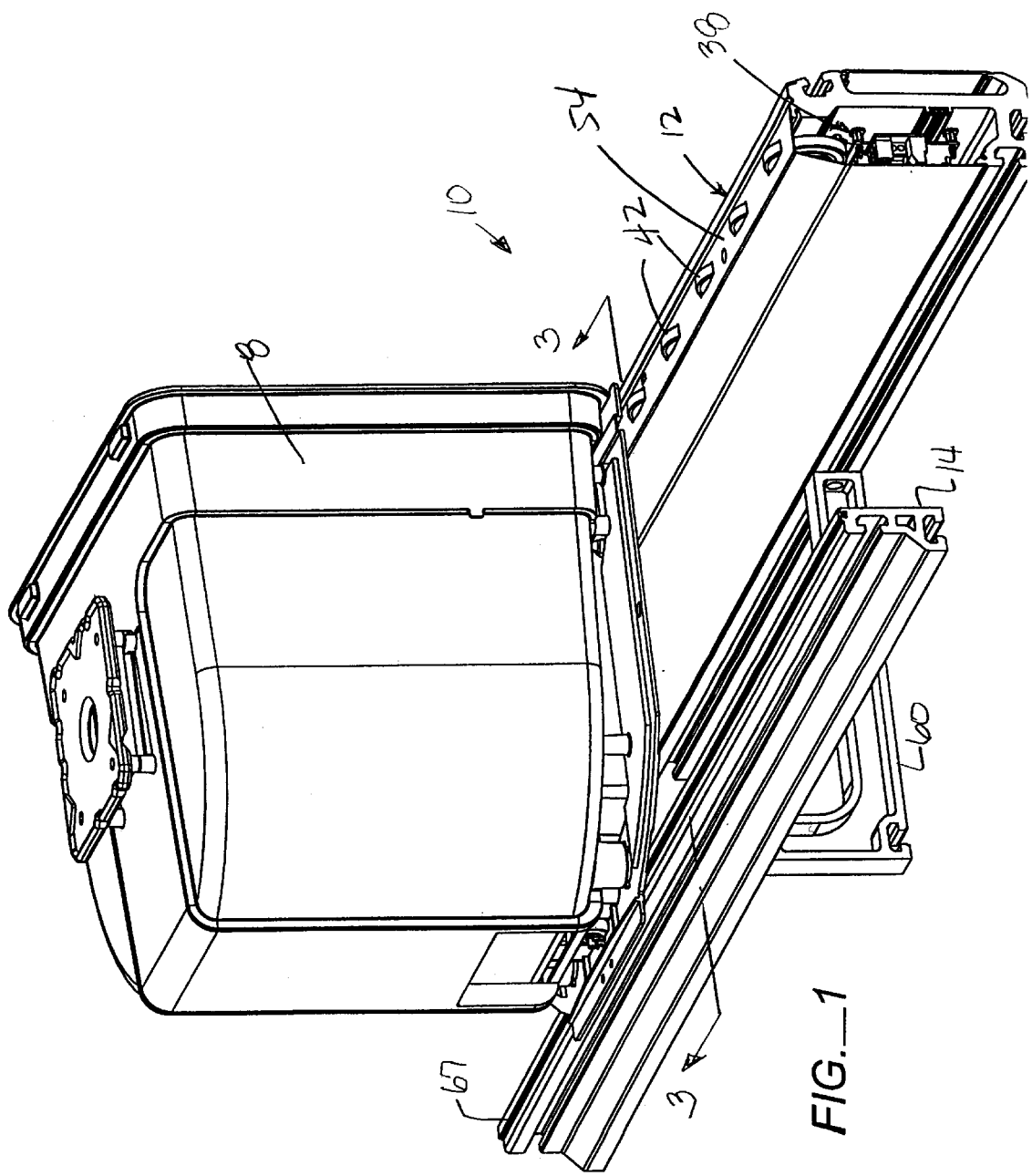
FIG. 1 is a pictorial view of a section of a conveyor system in accordance with the present invention.

Reference will now be made in detail to the preferred embodiment of the invention, which is illustrated in the accompanying figures. Turning now to the drawings, wherein like components are designated by like reference numerals throughout the various figures, attention is directed to FIGS. 1 and 2.

Figure 2:
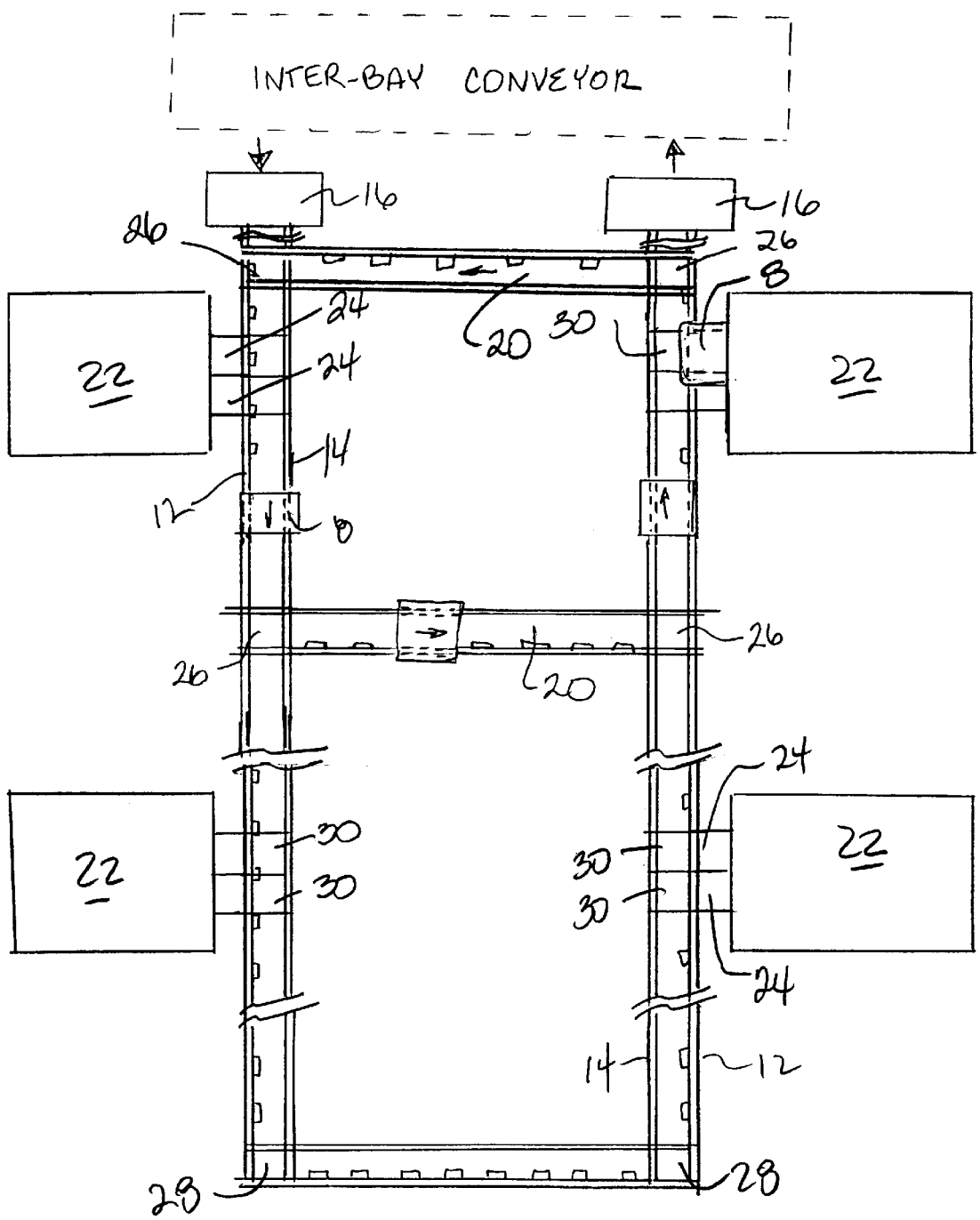
FIG. 2 is a schematic view of an example of an inter-bay loop of the conveyor system of FIG. 1.

FIG. 1 shows a section of a conveyor system 10 constructed in accordance with the present invention, while FIG. 2 schematically illustrates an example of a possible layout configuration for the conveyor system 10. The conveyor system 10 provides a safe, efficient transport mechanism for moving articles or a protective container or transport pod housing one or more articles. In the illustrated embodiment, several semiconductor wafers W (FIG. 3) are held in the protective environment of a transport pod 8 for transport, although other types of containers may also be used. The term "transport pod" is used throughout the specification as it is a common term employed in the art, although it is to be understood that the term is not to be limited to a holder for wafers but is intended to encompass any type of container for housing any type of articles. Instead of wafer transport, it is to be understood that the system of this invention may be used to transport other types of materials, particularly delicate materials where substantial care must be taken in handling the materials such as pharmaceuticals, medical systems, flat panel displays, hard disk drives and other types of computer equipment. The conveyor system 10 is designed to meet the strict requirements for operation in a clean room environment. However, the system may also be used in other environments where elimination or minimization of particulate contamination is not an issue.

As shown in FIG. 1, the conveyor system 10 generally includes a pair of rails 12, 14 for supporting the transport pod 8 as it is moved along the conveyor path. The rail 12 functions as a drive rail which propels and guides the transport pod 8 along the rails 12, 14. All power for moving the pod 8 is supplied via the drive rail 12. Rail 14 is an idler or support rail with the sole function of supporting the transport pod 8 such that the pod 8 is held in a level, uniformly balanced orientation as it is moved along the conveyor path. The conveyor system 10 also includes a transport device for moving the wafers or other materials. As is discussed in more detail below, in the present embodiment the transport device cooperates with the drive rail 12 to constrain movement of the device in both the vertical and lateral directions, while the idler rail 14 cooperates with the transport device to constrain only vertical movement of the transport device. In this embodiment, as shown in FIGS. 1 and 3, the transport device is part of the transport pod 8. In other embodiments of the invention, as shown for example in FIG. 8, the conveyor system 10 includes a transport device 80 which may be used to carry a transport pod, container, or one or more other articles along the conveyor path. In this embodiment, the front of the pod 8 rests on the drive rail 12 while the rear portion of the pod is supported by the idler rail 14. However, it is to be understood that this configuration could be reversed, with the idler rail being positioned toward the front of the pod 8 and the drive rail 12 supporting the rear portion of the transport pod.

As shown in FIG. 2, and described in more detail below, the conveyor system is particularly suitable for simultaneously transporting a plurality of transport pods 8 or other transport devices. Four pods 8 are shown in FIG. 2 for illustrative purposes. However, it is to be understood that the number of transport pods 8 carried by the conveyor system 10 may be increased dramatically. In the example shown in FIG. 2, the drive rail 12 and idler rail 14 are arranged in an intra-bay loop 18 which includes one or more cross sections 20 which may be used to transfer the pods 8 from one part of the loop 18 to another without requiring that the pod traverse the entire loop, providing greater flexibility in the movement of the pods 8. This arrangement may be useful where a manufacturing facility has duplicate processing machines. However, for bays in which each pod must be delivered to each processing machine in succession, a simple continuous loop is preferred as it leaves the middle of the intra-bay loop 18 free for service and maintenance traffic.

The pods 8 are delivered to the intra-bay loop 18 by a stocker 16 which receives the pods from an inter-bay transport system. The inter-bay transport system is preferably elevated to maximize the available space in the inter-bay area for the movement of workers, maintenance and service equipment and the like. The conveyor system 10 of this invention may be used in the inter-bay area, preferably by suspending the conveyor system 10 from an overhead frame, with the conveyor delivering transport pods to the stockers 16. Instead of using the conveyor system 10 of this invention, other types of systems may be used for the inter-bay transport device.

The intra-bay loop 18 transports the pods 8 between the semiconductor processing machines 22 positioned in the bay. Four processing machines 22 are shown in the bay for illustrative purposes, with the actual number of processing machines located in each bay depending upon the constraints imposed by the specific manufacturing process as well as the physical size of the machines and manufacturing facility. The processing machines 22 may be any of a variety of types of machines used to process semiconductor wafers including, but not limited to, deposition equipment and machines for cleaning or conditioning the semiconductor wafers at various stages during processing.

The transport pods 8 are moved between the main leg of the intra-bay loop 18 and the cross sections 20 via intersections 26. The intersections 26 provide a means of redirecting the pod 8 as it is moved along the drive and idler rails 12, 14. The intersections 26 may take a variety of forms. For example, the transport pod 8 may be redirected by lifting the pod 8 above the rails 12, 14, rotating the pod 90° to insure the same side of the transport pod 8 is always aligned with the drive rail 12, and lowering the pod onto a portion of the drive rail 12 of the new path. With other layout designs it may be necessary to rotate or turn the transport pod 8 by a different amount. If no redirection of the pod is necessary, the pod 8 is allowed to move across the intersection 26 without changing directions.

With the layout shown in FIG. 2, the intra-bay loop 18 also includes a pair of intersections 28 which join the inward-directed and outward-directed legs of the main path of the intra-bay loop 18. The intersections 28 differ from the intersections 26 in that the intersections 28 are used to redirect the section of the conveyor 10, not to direct the transport pods 8 between two different sections of the conveyor. The intersection 28 may be constructed to rotate or swing a section of the drive rail 12 to change the orientation of the drive rail 12, with the drive rail 12 propelling the pod 8 onto and off of the intersection 28. Alternatively, the intersection 28 may include a curved drive rail which turns the pod around a corner to change the direction of travel. The intersections 28 may also be the same as the intersections 26 if desired.

The layout of the conveyor system 10 shown in FIG. 2 also includes transfer assemblies 30 which automatically move the transport pod 8 between the intra-bay loop 18 and the load ports 24 of the processing machines 22. In the illustrated embodiment, the drive and idler rails 12, 14 are generally located at the level of the load ports 24. The transfer assembly 30 includes a lifting mechanism which lifts the transport pod 8 above the drive and idler rails 12, 14, separating the pod from the rails. The transfer assembly 30 also includes a drive system which propels the pod forward until it is properly positioned above the load port 24, the proper position being determined by the design of the load port. Other types of transfer assemblies may also be used to transfer the transport pod 8 from the conveyor to the load port 24. Instead of depositing the pod on the load port 24, it is to be understood that the transfer assembly may be designed to support the transport pod or other article at the machine 22 or other workstation.

Using the conveyor system 10 of this invention, the transport pods 8 may be efficiently and conveniently transported between the processing machines within each bay. The transport pods 8 are automatically coupled to the load port 24 of each machine 22 for unloading and processing of the wafers. After the pods 8 have been automatically filled with the processed wafers, the pods 8 are automatically returned to the rails 12, 14 and moved along the intra-bay loop. The pods 8 are safely and securely supported by the conveyor system 10, the intersections 26 and 28 and the transfer assemblies 30 as the pods are manipulated within the bays, protecting the delicate, expensive wafers from becoming damaged or destroyed during handling. Moreover, the transport pods 8 are accelerated, decelerated, and moved in a gentle, controlled manner which minimizes the stresses imposed on the wafers by the motion of the transport pods 8.

The conveyor system 10 of this invention is described in more detail in relation to FIGS. 1 and 3–10. As shown particularly in FIG. 3, the transport pod 8 is supported by the drive rail 12 and the idler rail 14. The drive rail 12 includes a drive system, generally designated at 38 in FIG. 4, for propelling the pod 8 along the rails 12, 14. In the illustrated embodiment of the invention, the drive system 38 includes a plurality of separate drive assemblies 40. One drive assembly 40 is shown in FIG. 5. In this embodiment, the drive assembly includes a plurality of drive wheels 42 which frictionally engage the underside of the transport pod 8 to propel the transport pod 8 along the drive rail 12. The drive assembly 40 includes a plurality of spaced-apart drive wheels 42. As shown in FIG. 4, the drive assemblies 40 are located along the rail such that the separation between the outermost drive wheels 42 of adjacent drive assemblies 40 is substantially equal to the spacing between the drive wheels 42 of the individual drive assembly 40. However, it is to be understood that the spacing between the drive assemblies may be increased or decreased so long as the transport pod 8 can straddle the gap between the drive assemblies 40 and still contact at least one wheel 42 of each assembly 40. The drive wheels 42 project upwardly from the drive rail housing 54 such that it is the drive wheels 42 of the rail 12 which directly support the transport pod 8. The wheels 42 are preferably mounted at approximately the same height to minimize tipping or rocking of the pod 8 as it is moved along the rails 12, 14. In the present embodiment, the drive system 40 includes five wheels 42. However, it is to be understood that in other modifications of the invention, the drive assemblies 40 may have a greater or lesser number of wheels. Further, the size of the wheels may be increased or decreased.

A hub 44 projects outwardly from the drive wheel 42 as shown particularly in FIG. 3. A drive belt 46, shown particularly in FIGS. 4 and 5, extends around the hubs 44 of the drive wheels 42 to couple the drive wheels to a motor 48. The motors 48 may be capable of clockwise and counterclockwise directions of rotation, allowing the transport pods 8 to be moved forward or backward along the rails 12, 14 upon receipt of appropriate signals. The drive system 40 also includes at least one tensioner pulley 50 for maintaining a uniform belt tension and at least one idler pulley 51.

The drive assemblies 40 operate independently, providing greater control over the movement of the transport pod 8. In the present embodiment, the drive system 38 is composed of a plurality of operational zones Z, with each zone Z including one drive assembly 40. However, in other embodiments of the invention the zones may each include more than one drive assembly 40. The drive speed and direction (forward or reverse) of each zone is independently controlled. The drive systems 40 of adjacent operational zones are accelerated and decelerated at the same rate such that at the time of transfer, the speed imposed on the transport pod 8 by the adjacent drive assemblies 40 is synchronized at the time of transfer between the zones. When a pod 8 is being propelled along the conveyor, only the operational zone directly below a pod 8 and one or more zones adjacent the pod 8 are active at any time; that is, only the drive assemblies 40 in these zones are in operation. This reduces the power consumption of the system and extends the operational life of the drive assemblies 40. The drive zones below and adjacent to other pods may be held in an inactive mode, allowing a plurality of pods to accumulate in an area of the conveyor, such as before one of the processing machines 22. The moving pods are preferably separated by at least one empty zone, in which there is no pod, to provide a buffer between pods 8 and protect the pods against inadvertently bumping into one another. The spacing between the pods is preferably increased as the velocity of the pod increases to provide a safe stopping distance at all times. When they are not in motion, the pods may occupy adjacent drive zones.

Each zone includes one microprocessor or control device 52 for controlling operation of the drive assembly 40 in that zone. The control device 52 is coupled to a control system (not shown) which controls overall operation of the invention. The configuration of the control system is subject to considerable variation within the scope of this invention. For example, the control system may include a computer for controlling operation of the conveyor 10, intersections 26 and 28, and transfer devices 30 within each bay, with the computer being coupled to the control devices 52 of each of the drive zones as well as the control devices of the intersections 26, 28 and transfer devices 30. The computer may also monitor the status of the load ports 24 and, when the ports are filled, stop the approaching transport pods 8 at spaced apart locations upstream from the filled load port to prevent collisions between the pods. The computers of each bay may be stand-alone systems or the computers may be part of a network which includes the control systems for the inter-bay conveyor, the stockers, and other automated components of the manufacturing facility. The central control system of the processing facility may also monitor the processing machines.

As shown in FIG. 6, each zone includes at least one sensor 53 for detecting the presence-of a pod 8 within the zone. In the present invention, a pair of sensors 53 are provided in each zone. The sensors 53 are located near the entrance and exit of the zone to detect when the pod enters and leaves the zone. This data on the location of the pod 8 is used to activate the drive zones downstream from the sensor such that the wheels 42 are active and operating at the same speed as the wheels 42 in the previous zone when the pod reaches the zone. The data is also used to deactivate drive assemblies after the pod 8 has left the operational zone. The time required for the pod to travel between the sensors may be used to monitor the actual speed of the pod as it travels across the zone. The sensors are used to monitor the location of each of the transport pods 8 and increase or decrease the speed of the individual transport pods 8 accordingly.

The drive system 38 of the illustrated embodiment provides a clean, efficient drive mechanism for moving the pod 8 along the drive rail 12 in a precise controlled manner. However, it is to be understood that other types of drive systems may be used in other embodiments of the invention. For example, the drive system may be provided by linear induction motors, with the transport device including a magnet or suitable metal for driving the pod in response to the linear induction motors. Other drive systems may also be employed. Using the independent drive assemblies 40 of this invention, the movement of several pods may be independently controlled. Thus, synchronization of the transport pods 8 along the loops or precise control over the spacing between the pods 8 along the conveyor system 10 is not required. Using one common drive system would not permit such precise control over the drive speed.

As shown in FIG. 3, the drive wheel 42 cooperates with the transport device, which in this embodiment is part of the transport pod 8, to propel and guide the pod 8 along the path. The drive wheel 42 engages a groove 56 formed in the underside of the pod 8. As shown particularly in FIG. 7, in the present embodiment the side rails of the groove 56 are tapered outwardly to minimize contact between the walls of the groove and the drive wheels 42, minimizing friction between the wheels 42 and the groove 56 and reducing wear and tear on the wheels. This is of particular advantage when the conveyor 10 is used in a clean room environment where minimizing sources of particulate contamination is important. However, in non-clean room applications a groove configuration in which there is some contact between the walls of the groove and the wheels may be employed. The groove 56 of this embodiment has a depth of about 5 mm, with the tapered side walls having a height of about 3.5 mm. The width of the bottom of the groove is about 8.5 mm, with the side walls being oriented at an angle of 30°.

The groove 56 defines the horizontal plane in which the pods sits on the drive wheels 42. The engagement between the drive wheels 42 and the groove 56 controls lateral or side-to-side movement of the pod 8 as well as vertical movement of the pod. While the combination of the groove 56 and drive wheels 42 is preferred, it is to be understood that the groove 56 may be eliminated entirely provided the transport device, drive rail 12 or idler rail 14 include a guiding device for guiding the pod 8 as it moves along the rails 12, 14.

As discussed above, all means of propelling the transport pod 8 along the conveyor are carried by the drive rail 12. The idler rail 14 cooperates with the transport device, which in this embodiment is part of the transport pod 8, to support one side of the transport pod 8. As discussed above, the drive rail 12 controls the plane of the pod as it sits on the drive rail 12 as well as the lateral position of the pod. In accordance with this invention, the transport pod 8 is supported on the idler rail 14 in a manner which minimizes bumping, jolting or shimmying of the pod 8 as it is propelled along the rails. Thus, the idler rail 14 has little effect, if any, on the smooth, controlled movement of the transport pod 8 along the rails 12, 14. As shown particularly in FIGS. 1 and 3, the idler rail 14 is parallel to and spaced from the drive rail 12. One or more connectors 60 are mounted to the drive and idler rails 12, 14 to maintain a predetermined spacing between the rails and facilitate installation of the conveyor. The connector 60 may extend the entire length of the rails 12, 14, or the connector 60 may be provided by a plurality of connecting members positioned at intervals along the rails 12, 14. The drive rail 12 and connectors 60 may be mounted to a suitable mounting frame (not shown). Alternatively, the drive and idler rails 12, 14 may be suspended from the ceiling by an overhead frame (not shown). The components of the conveyor system are mounted to the supporting structure using suitable means as is known in the art. For example, the conveyor 10 of the illustrated embodiment is provided with a first pair of mounting channels 62 which may be used to mount the conveyor to a floor support frame, and a second pair of channels 64 which may be used to mount the conveyor to an overhead support frame.

The pod 8 rides along the upper surface of the idler rail 14 as discussed in more detail below. In the illustrated embodiment, a pad or cushion material 67 is provided along the upper surface of the rail 14 to provide the pod with a smoother ride. The pad 67 is formed of a resilient material such as urethane which will not readily shed particles after the conveyor has been in use for extended periods of time. Instead of a pad 67, the pod 8 may ride directly on the upper surface of the rail 14. The upper surface of the pad 67, or the rail 14 if no pad is employed, is preferably a planar surface having a substantially horizontal orientation. However, the surface may also have a different topography. For example, the idler rail 14 may be in the form of a V-rail. In non-clean room applications, the upper surface may be provided with a longitudinally extending groove (not shown) to ensure the transport pod 8 does not begin to veer off of the rails 12, 14. This design is not feasible for clean room applications as the groove in the rail 14 provides a trap for dirt and other particulate contamination. The variations in the configuration of the idler rail 14 which may be used to guide the pod 8 may be provided instead of the groove 56, or in addition to the groove 56 provided they do not compete in guiding the pod.

As is shown particularly in FIGS. 3, 8 and 9, the transport pod 8 includes a shoe 68 which rides along the upper surface of the idler rail 14. In the preferred form of the invention, the shoe 68 is provided by a wheel 70. However, it is to be understood that the shoe 68 may take other forms including, but not limited to, a fixed support having an anti-friction plastic surface, an air bearing and a magnetic levitation bearing. The wheel 70 is rotatably mounted to the transport pod 8 via a shaft 72. The shaft 72 may be supported in sealed bearings (not shown) carried by the transport pod 8, although other means may be used to mount the shaft to the transport pod 8. The wheel 70 is preferably formed of plastic with integral sealed ball bearings or another material which is suitable for use in a clean room environment. In the illustrated embodiment, where the idler rail 14 includes pad 67, the thickness of the wheel 70 is preferably greater than the width of the pad 67. A narrower wheel may form a groove in the surface of the pad 67 over time, creating a source of friction as the sides of the wheels rub against the pad and a trap for dirt and other particulate contamination. However, it is to be understood that wheels having a width equal to or narrower than the width of the pad 67 may be employed in non-clean room environments. In another modification of the invention, the wheel 70 may be provided with an annular groove of sufficient width to receive the upper surface of the rail 14. The raised edges of the wheel on opposite sides of the groove would extend below the upper surface of the rail 14 and ensure the wheel 70 remained squarely on the upper surface of the rail 14 as the transport pod 8 is propelled along the conveyor. Preferably, the side walls of the groove in the wheel would be tapered outwardly to minimize contact between the side walls and the sides of the idler rail 14.

As shown particularly in FIG. 8, in the illustrated embodiment the wheel 70 mounted to the base of the pod 8. The wheel 70 is positioned in a groove 74 which is wider than the width of the upper surface of the idler rail 14, and preferably sufficiently wider such that the walls of the groove 74 do not contact the idler rail 14. In this embodiment, the wheel 70 projects from the surface of the transport pod 8, about 1 mm. However, in other modifications of the invention the wheel may project further than 1 mm or the wheel 70 may be recessed into the groove 74. Moreover, it is to be understood that in other modifications of the invention the groove 74 may be eliminated.

As shown in FIG. 9, in the illustrated embodiment the transport pod 8 includes a single wheel 70. One limitation on the location of the wheel 70 is the location of the slots 78 on the underside of the pod which cooperate with the kinematic pins on the load port 24 to accurately position the pod 8 on the load port. In the embodiment shown in FIG. 6, the wheel 70 is located near the back edge of the pod 8 to maximize the spacing between the drive and idler rails 12, 14 for the use of auxiliary devices therebetween, and midway between the sides of the pod 8 to support the back portion of the pod 8 in a level orientation and prevent the pod 8 from tipping and hitting the rail. It is to be understood that the wheel 70 may also be located at different positions.

One shoe 68 is preferred as it offers the advantage of provided a smooth ride along the idler rail 14 with little or no shimmying as the pod 8 is transported by the drive wheels 42. Other advantages of a single shoe 68 include a minimum number of parts and improved reliability. However, the transport pod 8 may include a greater number of shoes 68 if desired. FIG. 10 shows an example of a transport pod 8 which includes two shoes 68. As with the previously described embodiment, both shoes 68 are provided by a wheel 70 which are each rotatably mounted to the transport pod by a shaft 72.

Figure 11:
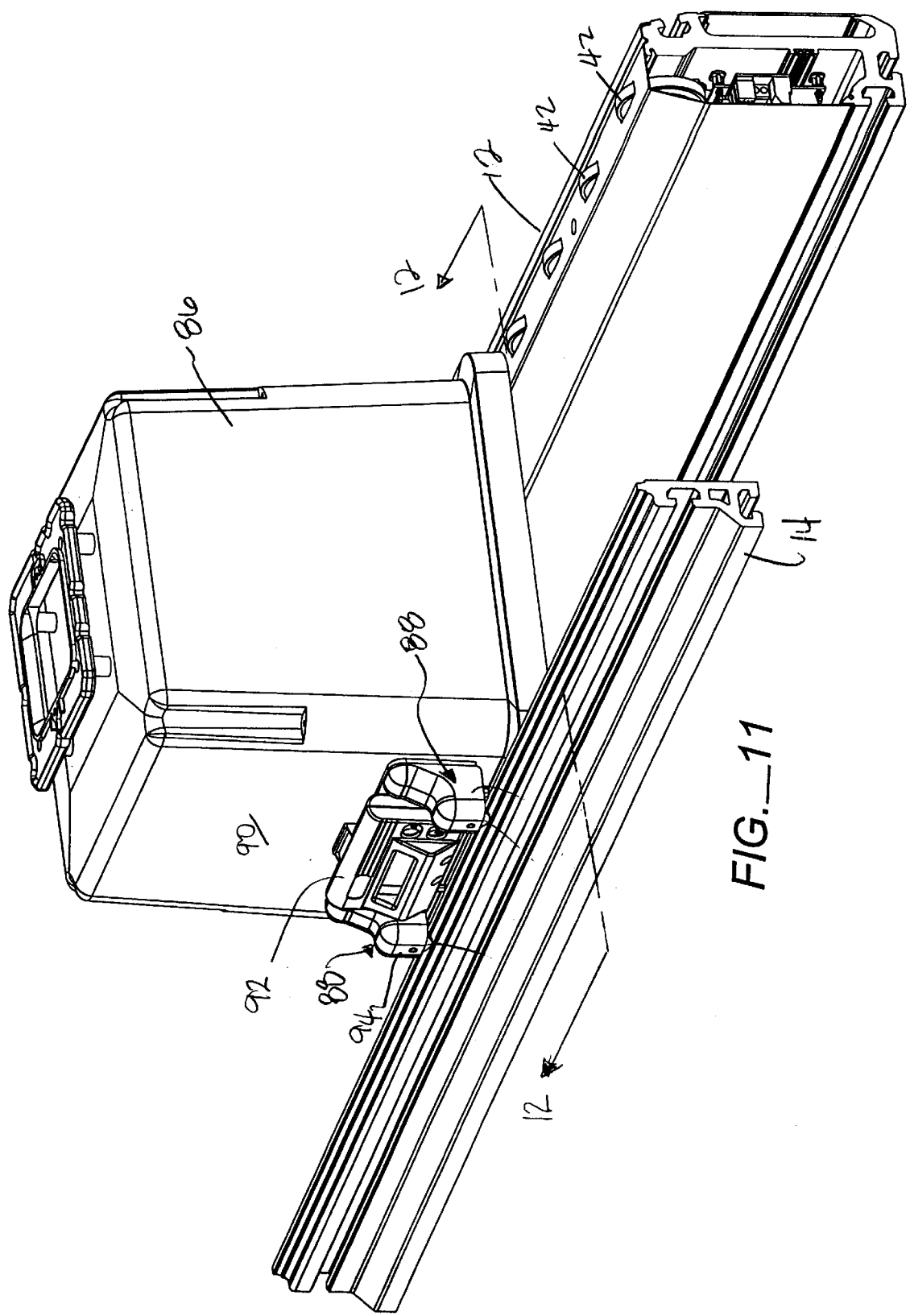
FIG. 11 is a pictorial view of a conveyor system in accordance with another embodiment of the present invention.

FIGS. 11–13 show another modification of the invention. In this modification, the transport device is again part of transport pod 86. However, it is to be understood that the transport device of this embodiment may instead be provided by a sled, pallet or other device which can support a transport pod, a container, or one or more other articles. In this embodiment of the invention, the drive wheels 42 engage the bottom surface of the pod 86 to propel the pod along the conveyor. The bottom surface of the pod 86 does not include the groove 56 of the previous embodiment but is instead substantially flat. Thus, while the drive wheels propel the pod and determine the height or horizontal plane of the pod, the drive wheels 42 do not control the lateral or side-to-side movement of the pod.

The pod 86 includes a pair of shoes 88 mounted to the wall 90 of the pod 86. In this modification, the pod 86 includes an information device 92 which is used in the art to store production information about the lot as the pod 86 is moved along the conveyor and the shoes 88 are positioned on either side of the information device 92. Each shoe 88 includes a housing 94 which rotatably supports a wheel 96. As shown in FIGS. 12 and 13, the wheel 96 has a groove 98 formed therein which rides on the v-shaped idler rail 14. The groove 98 and idler rail 14 cooperate to guide the transport pod 86 as it is moved along the rails 12, 14, thereby controlling lateral or side-to-side movement of the pod 86. The wheel 96 also controls the vertical position of the respective end of the pod 86.

As shown particularly in FIGS. 11 and 12, with this embodiment of the invention the idler rail 14 is spaced outwardly of the pod 86, increasing the gap between the idler rail 14 and drive rail 12 which may be used to accommodate auxiliary devices. The idler rail 14 is also positioned above the drive rail 12. One or more connecting members (not shown) join the idler and drive rails to accurately control the spacing between the rails and to ensure the idler rail 14 is positioned at the proper height above the drive rail 12.

In the previously described embodiments, the transport pod 8 serves the dual function of the pod 8 which houses the wafers in a protective environment and the transport device which moves along the rails 12, 14. However, it is to be understood that this invention is not to be limited to a transport pod which serves this dual role. In another embodiment of the invention, the transport device is separate from the pod or other container holding the wafers. This modification of the invention is also particularly suitable for use with applications other than semiconductor processing, where the transport device may be used to carry one or more articles or a container holding one or more articles. The configuration of the separate transport device is subject to considerable variation, depending in part upon the constraints imposed by the particular application. FIGS. 14 and 15 show an example of a transport device 100 in accordance with the modified embodiment of the invention. However, the transport device is not to be limited to the configuration shown in FIGS. 14 and 15.

The transport device 100 is used with the drive and idler rails 12, 14 shown in FIGS. 1–5, and reference is made to the description of these figures. In FIG. 14, the transport device 100 is shown holding a transport pod 102 which holds a plurality of wafers. However, it is to be understood that the transport device 100 may be used to carry other articles or materials within the scope of this invention, or other types of containers. The transport device 100 is provided by a sled which includes a base 104 and side walls 106 which extend upwardly from three sides of the base 104. Although not shown, the base 104 has pins 118 (FIG. 15) formed thereon which mirror the kinematic pins on the load port. The pins 118 engage the kinematic pin slots (not shown) on the underside of the pod to hold the pod in place. The side walls 106 are positioned just outside of the outer walls of the transport pod 102 so that the pod 102 fits snugly within the transport device 100, providing additional support and preventing rocking or shifting of the pod as the transport device 100 is moved along the conveyor. If desired, other means may be used instead of or in addition to the side walls 106 to securely hold the transport pod 102 on the device 100. For example, the device 100 may be secured to the sides and/or bottom of the transport pod 102 by bolts or other suitable fasteners. The transport pod 102 may also be secured to the transport device 100 using straps or other suitable means of attachment.

The transport pod 102 is positioned on the upper surface 108 of the base 104. If desired, the base 104 may be provided with one or more inward-extending grooves 110 to facilitate loading of the transport pod 102 onto the base 104. The underside of the base 104 is provided with a groove 112 and at least one shoe 114 and kinematic pin slots (not shown) which cooperate with the pins on the load port 24. As with the previously described embodiments, the shoe 114 is provided by a wheel 116 rotatably mounted to the base 104. The groove 112 and shoe 114 are similar to the groove 56 and shoe 68 of the previous embodiments and are not described in detail, reference being made to the previous description.

One advantage of the transport device 100 of the embodiment shown in FIGS. 14 and 15 is that it does not require a specific pod design. Instead, the transport device 100 may be used with transport pods or other types of containers which are currently being used to house semiconductor wafers.

When the conveyor system 10 of this invention is used to transport semiconductors, the components of the system 10, including the drive system 38 and shoe 68, are constructed of materials which are suitable for use in a clean room environment. In other words, operation of the components over extended periods of time will not generate significant levels of particulate contamination. These constraints will not be present for other applications of the conveyor 10 of this invention which do not require a clean room environment. For non-clean room environments, materials which do not meet clean room standards may be employed for all components of the conveyor system 10.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best use the invention and various embodiments with various modifications as are suited to the particular use contemplated. It is intended that the scope of the invention be defined by the Claims appended hereto and their equivalents.

What is claimed is:

1. A conveyor for transporting articles between workstations comprising:

a transport device for carrying at least one article between workstations including;

a base having a groove formed therein;

a drive rail for supporting said transport device, said drive rail including a drive system for propelling said transport device between workstations, said drive system engaging said groove in said transport device to guide said transport device as said transport device moves along said drive rail;

a support rail parallel to and spaced from said drive rail for supporting said transport device;

at least one shoe carried by said transport device, said shoe being configured to ride on said support rail for movably supporting said transport device on said support rail.

2. A protective container for carrying a plurality of articles along a conveyor system, the conveyor system including a drive rail and a support rail spaced from and parallel to the drive rail for supporting said container, the drive rail including a drive system for propelling and guiding said container along the drive and support rails, said container including:

a housing enclosing an interior compartment configured to retain a plurality of articles, said housing having a bottom surface positionable on the drive and support rails of the conveyor system, said bottom surface having a groove shaped to engage the drive system such that actuation of the drive system propels the housing along the drive and support rails; and at least one shoe carried by said housing, said shoe being configured to ride on the support rail of the conveyor system to movably support said housing on the support rail.

* * * * *